United States Patent
Park et al.

(10) Patent No.: US 9,021,182 B2
(45) Date of Patent: Apr. 28, 2015

(54) FLASH MEMORY FOR CODE AND DATA STORAGE

(75) Inventors: Eungjoon Park, Fremont, CA (US);
Robin John Jigour, San Jose, CA (US);
Jooweon Park, Pleasanton, CA (US);
Masaru Yano, Tokyo (JP)

(73) Assignee: Winbond Electronics Corporation, Taichung (TW)

( * ) Notice: Subject to any disclaimer, the term of this patent is extended or adjusted under 35 U.S.C. 154(b) by 211 days.

(21) Appl. No.: 13/250,077

(22) Filed: Sep. 30, 2011

(65) Prior Publication Data

US 2012/0084491 A1   Apr. 5, 2012

Related U.S. Application Data

(60) Provisional application No. 61/389,253, filed on Oct. 3, 2010.

(51) Int. Cl.
G06F 12/02 (2006.01)
G11C 11/00 (2006.01)
G11C 16/04 (2006.01)

(52) U.S. Cl.
CPC .... G06F 12/0246 (2013.01); G06F 2212/7208 (2013.01); G11C 11/005 (2013.01); G11C 16/0416 (2013.01); G11C 16/0483 (2013.01); G11C 2216/30 (2013.01)

(58) Field of Classification Search
CPC ............... H01L 2924/00; H01L 2224/48227
USPC ................ 711/103; 710/110, 313
See application file for complete search history.

(56) References Cited

U.S. PATENT DOCUMENTS

| | | | |
|---|---|---|---|
| 5,724,303 A | 3/1998 | Gannage et al. | |
| 5,822,245 A | 10/1998 | Gupta et al. | |
| 5,862,099 A | 1/1999 | Gannage et al. | |
| 6,725,403 B1 * | 4/2004 | Schmoelz | 714/723 |
| 7,558,900 B2 * | 7/2009 | Jigour et al. | 710/305 |
| 7,793,031 B2 | 9/2010 | Sartori et al. | |
| 2004/0013177 A1 * | 1/2004 | Sorrells et al. | 375/219 |
| 2004/0027851 A1 * | 2/2004 | Lai | 365/149 |
| 2006/0067123 A1 * | 3/2006 | Jigour et al. | 365/185.05 |
| 2006/0212693 A1 * | 9/2006 | Cho et al. | 713/1 |
| 2006/0227609 A1 * | 10/2006 | Pascucci et al. | 365/185.17 |
| 2007/0217102 A1 * | 9/2007 | Chuang | 361/56 |
| 2007/0297232 A1 * | 12/2007 | Iwata | 365/185.17 |
| 2008/0144375 A1 * | 6/2008 | Cheng | 365/185.05 |
| 2009/0103364 A1 | 4/2009 | Pekny et al. | |
| 2009/0235013 A1 * | 9/2009 | Seo | 711/103 |

(Continued)

OTHER PUBLICATIONS

SpiFlash 128 M-Bit Serial Flash Memory with Dual and Quad SPI: Preliminary Revision D, Jul. 8, 2010, Winbond Electronics Corp.*

(Continued)

*Primary Examiner* — Aimee Li
*Assistant Examiner* — Kenneth Tsang
(74) *Attorney, Agent, or Firm* — David H. Carroll

(57) ABSTRACT

A flash memory for code and data storage includes a code memory array having fast read access and suitability for execute in place, a data memory array having the characteristics of low bit cost and high density storage, and a suitable interface to provide access to both the code and data. The code memory array may be a NOR array or a performance-enhanced NAND array. The memory may be implemented in a single chip package or multi-chip package solution.

3 Claims, 7 Drawing Sheets

(56) References Cited

U.S. PATENT DOCUMENTS

2009/0251954 A1* 10/2009 Wang et al. .................. 365/163
2009/0276561 A1    11/2009 Pekny et al.
2011/0022776 A1*  1/2011 Hekstra et al. ................ 711/103
2011/0051519 A1*  3/2011 Lee et al. ................. 365/185.18

OTHER PUBLICATIONS

AEC-Q100 Reliability Report, Nov. 19, 2010, Winbond Electronics Corp.*

Micron Serial NAND Flash Memory, 2008, Micron Technology, 1-2.*

Toshiba NAND vs. NOR Flash Memory Technology Overview, 2006, Toshiba, 1-4.*

Spansion MirrorBit SPI Multi I/O Flash Memory, 2008, FIND Fujitsu Semiconductor Magazine, vol. 26, No. 4, pp. 1-3.*

Hynix Semiconductor Inc., 1Gb NAND Flash, HY27US081G1M, HY27US161G1M,. Rev 0.2, May 2007, 39 pages.

M-Systems Inc., Two Technologies Compared: NOR vs. NAND White Paper, 91-SR-012-04-8L, Rev. 1.1, Jul. 2003, 14 pages.

Micron Technology, Inc., NAND Flash Memory MT29F2G08AABWP, MT29F2G16AABWP, MT29F4G08BABWP, MT29F4G16BABWP, MT29F8G08FABWP, 2004, 57 pages.

Micron Technology, Inc., Technical Note: NAND Flash 101: An Introduction to NAND Flash and How to Design It in to Your Next Product, 2006, 27 pages.

Nexflash Technologies, Inc NX25F641C 64M-Bit Serial Flash Memory with 4-Pin SPI Interface, Apr. 2002, 23 pages.

Park, Eungjoon et al., Flash Memory for Code and Data Storage, U.S. Appl. No. 61/389,253, Oct. 3, 2010, 273 pages.

Toshiba America Electronic Components, Inc., NAND vs. NOR Flash Memory Technology Overview, Apr. 25, 2006, 4 pages.

Winbond Electronics Corporation, W25Q128BV 128M-Bit Serial Flash Memory with Dual and Quad SPI, Preliminary Revision D, Jul. 8, 2010, 72 pages.

Winbond Electronics Corporation, Parallel Flash Memory—W29GL Family, Rev. 1.0, Aug. 2010, 2 pages.

Winbond Electronics Corporation, SpiFlash Serial Flash Memories, Rev. 1.0, Aug. 2010, 2 pages.

EE Times Asia. Multi-I/O SPI flash enables faster data transmission [online], May 25, 2009 [retrieved on Mar. 18, 2014]. Retrieved from the Internet: <URL: http://www.eetasia.com/ART_8800573481_499486_NP_158dc811.HTM.>. 3 Pages.

* cited by examiner

FLASH MEMORY FOR CODE AND DATA STORAGE

CROSS-REFERENCE TO RELATED APPLICATIONS

This application claims the benefit of U.S. Provisional Patent Application Ser. No. 61/389,253 filed Oct. 3, 2010, which hereby is incorporated herein in its entirety by reference thereto.

BACKGROUND OF THE INVENTION

1. Field of the Invention

The present invention relates to flash memory, and more particularly to flash memory for both code and data storage.

2. Description of Related Art

Flash memory is a non-volatile computer storage technology that is electrically erasable typically in large blocks, which gives it a speed advantage over small-block EEPROM technology. Flash memory stores digital data in an array of memory cells made from charge-storing floating-gate transistors, which may be single-level or multi-level. The array may be NOR-type or NAND-type. While both serial and parallel flash memory interfaces are in use, serial flash is becoming increasingly popular due to cost, space and pin-count advantages.

In NOR-type flash memory, each memory cell is connected between a bit line and ground. Reading typically is done by bringing a word line high, whereby the corresponding cell either pulls the output bit low or not depending on the logical state of the cell. Writing (setting the cell to a logical 0) typically is done on a word-by-word or byte-by-byte basis using hot electron injection. Erasing (setting the cell to a logical 1) typically is done on a block-by-block basis using quantum tunneling.

The characteristics of standard NOR flash are lower density, high read speed, slow write speed, slow erase speed, and a random access interface. Since NOR flash has fast random-access memory read, microprocessors generally can use NOR flash memory as execute in place ("XIP") memory.

In NAND-type flash memory, a number of memory cells are connected in series between a bit line and ground. Reading typically is done by bringing the selected word line to a high voltage just over VT of an erased cell and the other word lines to cells within the string to a high voltage just over VT of a programmed cell, whereby the string under control of the corresponding cell either pulls the output bit low or not depending on the logical state of the cell. The strings in turn are connected to a NOR-type bit line array through a select gate. Programming (setting the cell to a logical 0) typically is done on a page-by-page basis (each block consists of a number of pages) using tunnel injection. Erasing (setting the cell to a logical 1) typically is done on a block-by-block basis using tunnel release.

The characteristics of NAND flash are high density, medium read speed, high write speed, high erase speed, and an indirect or I/O like access. NAND-type flash memory is particularly well suited to systems requiring high capacity data storage. While NAND-type flash memory requires additional transistors relative to a same-sized NOR type flash memory, significantly reduced area requirements for the ground wires and bit lines allows a higher density and larger capacity per chip, at lower cost. NAND-type flash memory is written page-by-page, which is very suitable for sequential writes but not optimal for random access writes. Moreover, while reading and programming is performed page-by-page, erasure can only be performed on a block basis. Therefore, standard NOR-type flash memory is advantageous over standard NAND-type flash memory for random-access and execute in place. While code may be executed using NAND-type flash memory, it is typically done by copying a page into memory-mapped RAM and executed the code there.

To take advantage of the inherent properties of NOR-type and NAND-type flash memory, some systems such as full featured cell phones use memory architectures that combine NOR with NAND for data storage, with the different types of memory frequently being stacked in multi-chip packages ("MCP") to create a single component. See, e.g., Toshiba America Electronic Components, Inc., NAND vs. NOR Flash Memory: Technology Overview, Apr. 25, 2006. Unfortunately, the additional complexity and cost to these systems of managing both types of memory with their own interfaces can be significant. Moreover, to support two different interfaces, the controller requires more pins which increase the cost.

Solving the complicated issue of NAND flash management and providing full disk emulation, DiskOnChip can be used for both code and data storage, and is usually found in applications that require an operating system and a file system such as feature phones and smartphones, thin clients, POS workstations, digital gateways, set top boxes, and telecom infrastructure equipment. See, e.g., M-Systems Inc., Two Technologies Compared: NOR vs. NAND, White Paper, Rev. 1.1, July 2003. However, DiskOnChip is expensive.

BRIEF SUMMARY OF THE INVENTION

What is needed is a single flash memory solution that is relatively easy and economical to incorporate into systems while providing high capacity data storage and execute-in-place. The present invention includes the following illustrative embodiments.

(1) A flash memory comprising: a code flash memory array; a data flash memory array; and an interface for providing access to the code flash memory array and the data flash memory array.

(2) A flash memory as in embodiment 1 wherein the interface is an interface for providing random access to the code flash memory array.

(3) A flash memory as in embodiment 1 or 2 wherein the interface comprises: a multi-IO serial interface coupled to the code flash memory array and the data flash memory array; or a NAND memory interface coupled to the code flash memory array and the data flash memory array; or a multi-IO serial interface coupled to the code flash memory array, and a multi-IO serial interface coupled to the data flash memory array; or a multi-IO serial interface coupled to the code flash memory array, and a NAND memory interface coupled to the data flash memory array; or a NAND memory interface coupled to the code flash memory array, and a NAND memory interface coupled to the data flash memory array.

(4) A flash memory as in embodiment 1, 2 or 3 further comprising a package, wherein: the flash memory is implemented in a single chip and the package is a single chip package; or the flash memory is implemented in plural chips and the package is a multiple chip package.

(5) A flash memory as in embodiment 1, 2, 3 or 4 wherein the multi-IO serial interface is a multi-IO SPI interface configurable as single SPI, dual SPI, and quad SPI.

(6) A flash memory as in embodiment 1, 2, 3 or 4 wherein the NAND memory interface is a standard NAND memory interface.

(7) A flash memory as in embodiment 1, 2, 3, 4, 5 or 6 wherein the code flash memory array is a NOR flash memory array.

(8) A flash memory as in embodiment 1, 2, 3, 4, 5 or 6 wherein the code flash memory array is a NAND code flash memory array having fast read speeds for supporting execute in place.

(9) A flash memory as in embodiment 8 wherein the NAND code flash memory array comprises strings of stacked NAND cells having 2, 4, 8 or 16 word lines per string.

(10) A flash memory as in embodiment 8 or 9 wherein the NAND code flash memory array is segmented into multiple arrays.

(11) A flash memory as in embodiment 8, 9 or 10 wherein some strings of stacked NAND cells in the NAND code flash memory array comprise plural bit lines per cell.

(12) A flash memory comprising: a NOR code flash memory array; a NAND data flash memory array; and a multi-IO SPI interface coupled to the NOR code flash memory array and to the NAND data flash memory array, the multi-IO SPI interface being configurable as single SPI, dual SPI, and quad SPI for providing access to the NOR code flash memory array and the NAND data flash memory array.

(13) A flash memory comprising: a NAND code flash memory array having fast read speeds for supporting execute in place; a NAND data flash memory array; and a multi-IO SPI interface coupled to the NAND code flash memory array and to the NAND data flash memory array, the multi-IO SPI interface being configurable as single SPI, dual SPI, and quad SPI for providing access to the NAND code flash memory array and the NAND data flash memory array.

(14) A flash memory as in embodiment 13 wherein the NAND code flash memory array comprises strings of stacked NAND cells having 2, 4, 8 or 16 word lines per string.

(15) A flash memory as in embodiment 13 wherein the NAND code flash memory array is segmented into multiple arrays.

(16) A flash memory as in embodiment 13 wherein some strings of stacked NAND cells in the NAND code flash memory array comprise plural bit lines per cell.

(17) A flash memory as in embodiment 13 wherein: the NAND code flash memory array comprises strings of stacked NAND cells having four word lines per string, and some strings of stacked NAND cells in the NAND code flash memory array comprise plural bit lines per cell.

DETAILED DESCRIPTION OF THE INVENTION, INCLUDING THE BEST MODE

Figure 1:
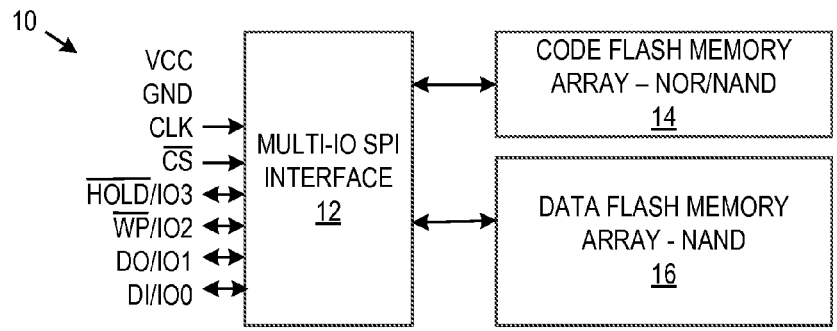
FIG. 1 is a schematic block diagram of an illustrative implementation of a flash memory for code and data storage.

FIG. 1 is a schematic block diagram of an illustrative implementation of a high speed flash memory 10 for code and data storage. The memory 10 includes a code memory array 14 having fast read access and suitability for execute in place ("XIP"), a data memory array 16 having the characteristics of low bit cost and high density storage, and a multi-IO interface 12 to provide configurable and low pin count serial access to both the code and data. The memory 10 may be implemented in a single chip package or multi-chip package solution, the single chip package solution being less expensive.

The multi-IO interface 12 illustratively a multi-IO SPI (Serial Peripheral Interface) interface, although other types of configurable serial interfaces may be used as well. The interface 12 shown in FIG. 1 is a six pin implementation (exclusive of power and ground) configurable as single SPI, dual SPI, and quad SPI. The pins provided are power VCC, ground GND, chip select CS, clock CLK, configurable pin DI($IO_0$), configurable pin DO($IO_1$), configurable pin/WP($IO_2$), and configurable pin/HOLD($IO_3$). For single SPI operation, the configurable pins are configured as data input DI, data output DO, write protect/WP, and hold/HOLD. For dual SPI, the configurable pins are configured as input/output 101, input/output 102, write protect/WP, and hold/HOLD. For quad SPI the configurable pins are configured as input/output 101, input/output 102, input/output 103, and input/output 104. The term "pin" is used herein to refer to an interface element on the serial flash memory used for external connection, whether a contact on a die such as a bonding pad, a contact mounted on a package including recessed contacts, flush contacts, and projecting contacts, and so forth.

The system 10 includes two flash memory arrays 14 and 16 which are accessible through the interface 12. The flash memory array 14 is specialized for code storage, while the flash memory array 16 is specialized for data storage. While each memory may be of any desired size, suitable sizes include 32 Mb and 1 Gb respectively, 16 Mb and 1 Gb respectively, 32 Mb and 512 Mb respectively, and 16 Mb and 512 Mb respectively. As the technology evolves, even larger memory arrays may become cost-effective.

The data flash memory array 16 may be NAND type implemented in a conventional manner to achieve low bit cost and high density. Illustratively, each string of the data flash memory array 16 may have 32 cells accessible by 32 word lines and a single bit line, although these values along with other aspects of the array may be adjusted as desired to achieve the desired low bit cost and high array density. Suitable NAND flash memory array technology is available from various manufacturers, including, for example, Micron Technology Inc. of Boise, Id., USA, and Hynix Semiconductor Inc. of Icheon, Korea. Illustrative examples of suitable NAND memory array technology are described in Micron Technology, Inc., NAND Flash Memory: MT29F2G08AABWP/MT29F2G16AABWP, MT29F4G08BABWP/MT29F4G16BABWP, MT29F8G08FABWP, Boise, Id., USA, 2004; Micron Technology, Inc., Technical Note: NAND Flash 101: An Introduction to NAND Flash and How to Design It In to Your Next Product, Boise, Id., USA, 2006; and Hynix Semiconductor Inc., 1 Gb NAND Flash: HY27US081G1M, HY27US161G1M, Rev. 0.2, Icheon, Korea, May 2007, which hereby are incorporated herein in their entirety by reference thereto.

The code flash memory array 14 may be implemented either with a NOR flash memory array or a NAND flash memory array. When implemented in NOR flash technology, the code flash memory array 14 may be implemented in a conventional manner to provide fast random access and therefore support execution in place ("XIP"). When accessing a NOR-type memory array, the quad SPI reduces instruction overhead from the single SPI value of 40 clocks to just 12 clocks. Suitable NOR flash memory array technology is available from various manufacturers, including Winbond Electronics Corporation of Taiwan, R.O.C.

When implemented in NAND flash technology, the code flash memory array 14 may be modified to emphasize enhanced performance over low bit cost and high memory density. These performance enhancements, which are described herein, provide random access read speeds that are faster than normally available from NAND memory and approach or are equal to NOR read speeds, and therefore support execute in place ("XIP").

Figure 2:
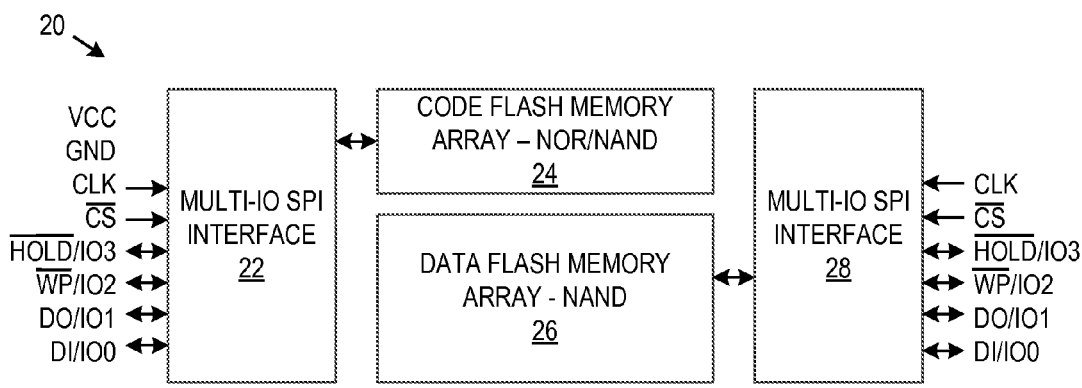
FIG. 2 is a schematic block diagram of another illustrative implementation of a flash memory for code and data storage.

FIG. 2 is a schematic block diagram of an illustrative implementation of another high speed flash memory 20 for code and data storage. The memory 20 includes a code memory array 24 (either NOR or NAND) having fast read access and suitability for execute in place ("XIP"), a multi-IO interface 22 to provide configurable and low pin count serial access to the code, a data memory array 26 having the characteristics of low bit cost and high density storage, and a multi-IO interface 28 to provide configurable and low pin count serial access to the data. The memory 20 may be implemented in a single chip package or multi-chip package solution, the single chip package solution being less expensive.

Figure 3:
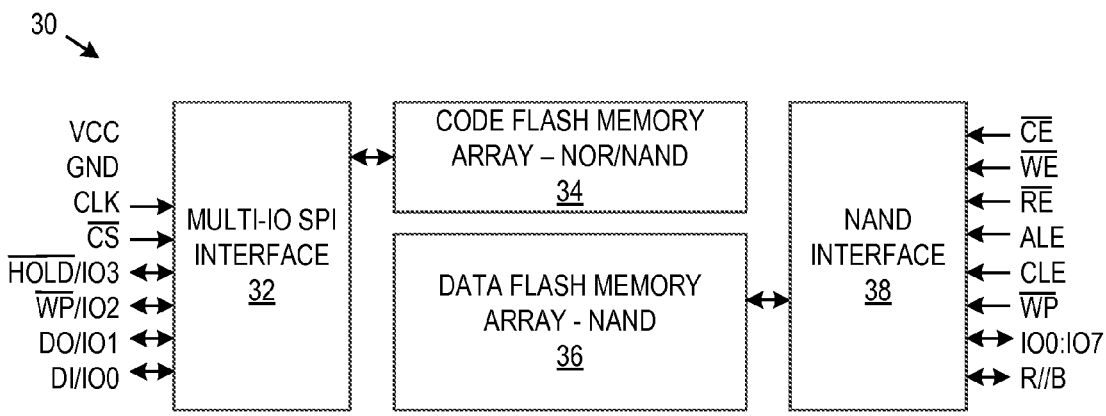
FIG. 3 is a schematic block diagram of another illustrative implementation of a flash memory for code and data storage.

FIG. 3 is a schematic block diagram of an illustrative implementation of another high speed flash memory 30 for code and data storage. The memory 30 includes a code memory array 34 (either NOR or NAND) having fast read access and suitability for execute in place ("XIP"), a multi-IO interface 32 to provide configurable and low pin count serial access to the code, a data memory array 36 having the characteristics of low bit cost and high density storage, and a NAND data array interface 38, illustratively a standard parallel NAND array interface with pins/CE, /WE, /RE, ALE, CLE, /WP, IO0:IO7, and R//B. The memory 30 may be implemented in a single chip package or multi-chip package solution, the single chip package solution being less expensive.

Figure 4:
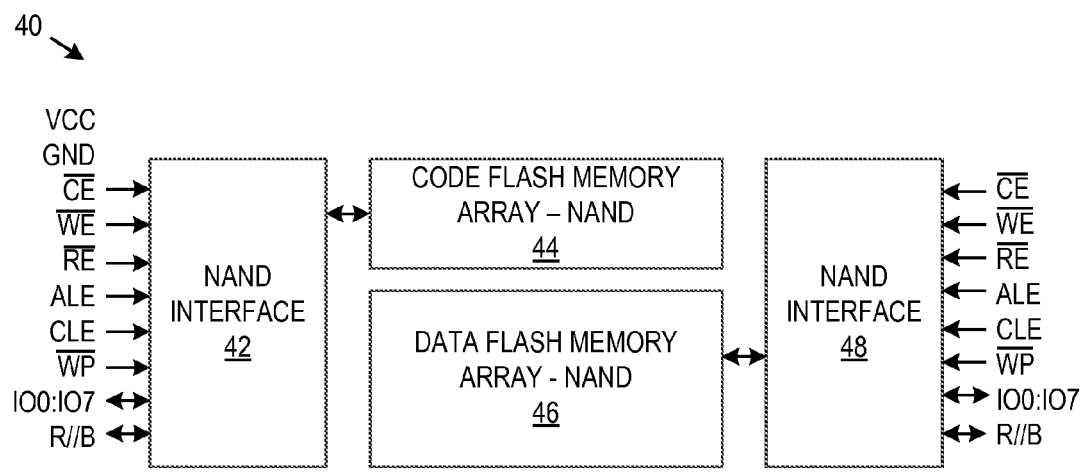
FIG. 4 is a schematic block diagram of another illustrative implementation of a flash memory for code and data storage.

FIG. 4 is a schematic block diagram of an illustrative implementation of another high speed flash memory 40 for code and data storage. The memory 40 includes an enhanced performance NAND code memory array 44 having fast read access and suitability for execute in place ("XIP"), a NAND data array interface 42, illustratively a standard parallel NAND array interface, a NAND data memory array 46 having the characteristics of low bit cost and high density storage, and a NAND data array interface 48, illustratively a standard parallel NAND array interface with pins /CE, /WE, /RE, ALE, CLE, /WP, IO0:IO7, and R//B. The memory 40 may be implemented in a single chip package or multi-chip package solution, the single chip package solution being less expensive.

Figure 5:
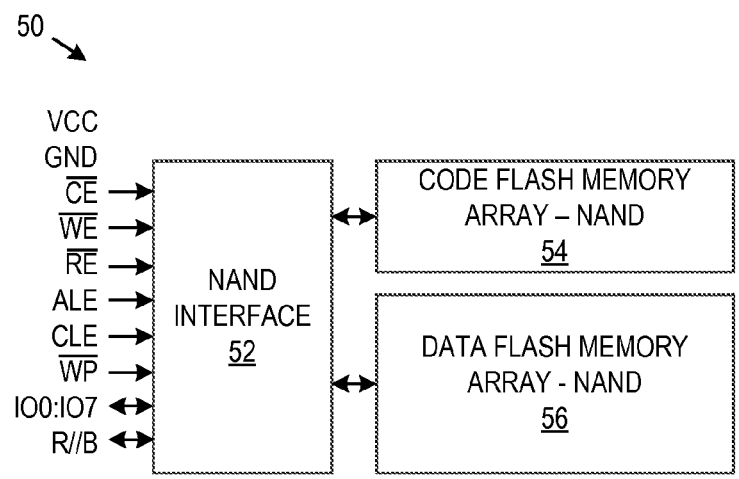
FIG. 5 is a schematic block diagram of another illustrative implementation of a flash memory for code and data storage.

FIG. 5 is a schematic block diagram of an illustrative implementation of another high speed flash memory 50 for code and data storage. The memory 50 includes an enhanced performance NAND code memory array 54 having fast read access and suitability for execute in place ("XIP"), a NAND data memory array 56 having the characteristics of low bit cost and high density storage, and a NAND data array interface 52, illustratively a standard parallel NAND array interface with pins /CE, /WE, /RE, ALE, CLE, /WP, IO0:IO7, and R//B to provide access to both the code and data. The memory 50 may be implemented in a single chip package or multi-chip package solution, the single chip package solution being less expensive.

Figure 6:
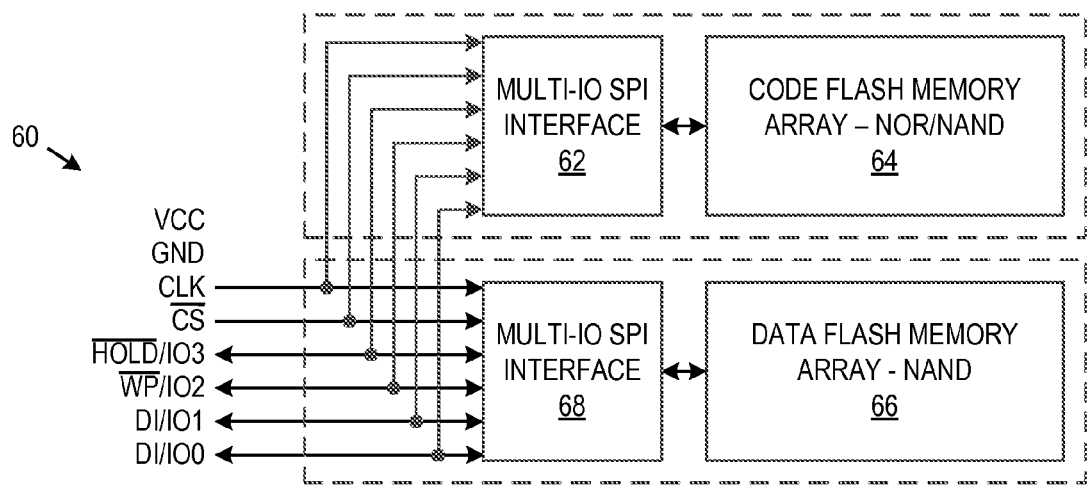
FIG. 6 is a schematic block diagram of an illustrative implementation of a flash memory for code and data storage that is particularly suitable for a multiple chip package implementation.

FIG. 6 is a schematic block diagram of an illustrative multi-chip package ("MCP") implementation of another high speed flash memory 60 for code and data storage. The memory 60 includes one chip having a code memory array 64 (either NOR or NAND) with fast read access and suitability for execute in place ("XIP"), and a multi-IO interface 62 to provide configurable and low pin count serial access to the code. The memory 60 also includes a second chip having a NAND data memory array 66 with the characteristics of low bit cost and high density storage, and a multi-IO interface 68 to provide configurable and low pin count serial access to the data. The pins from the two chips are combined to provide a single multi-IO SPI interface pin set external of the MCP. The MCP implementation shown in FIG. 6 may also be used for other arrangements of memory and interfaces such as those shown in FIG. 2 through FIG. 5.

While the multi-IO SPI interfaces provided for the memories shown in FIG. 1, FIG. 2, FIG. 3 and FIG. 6 and are particularly advantageous, other serial interfaces may be used if desired. While these multi-IO SPI interfaces are described as being configurable in single, dual or quad configurations, they may be configurable in fewer or more configurations as desired.

Figures 7, 8:
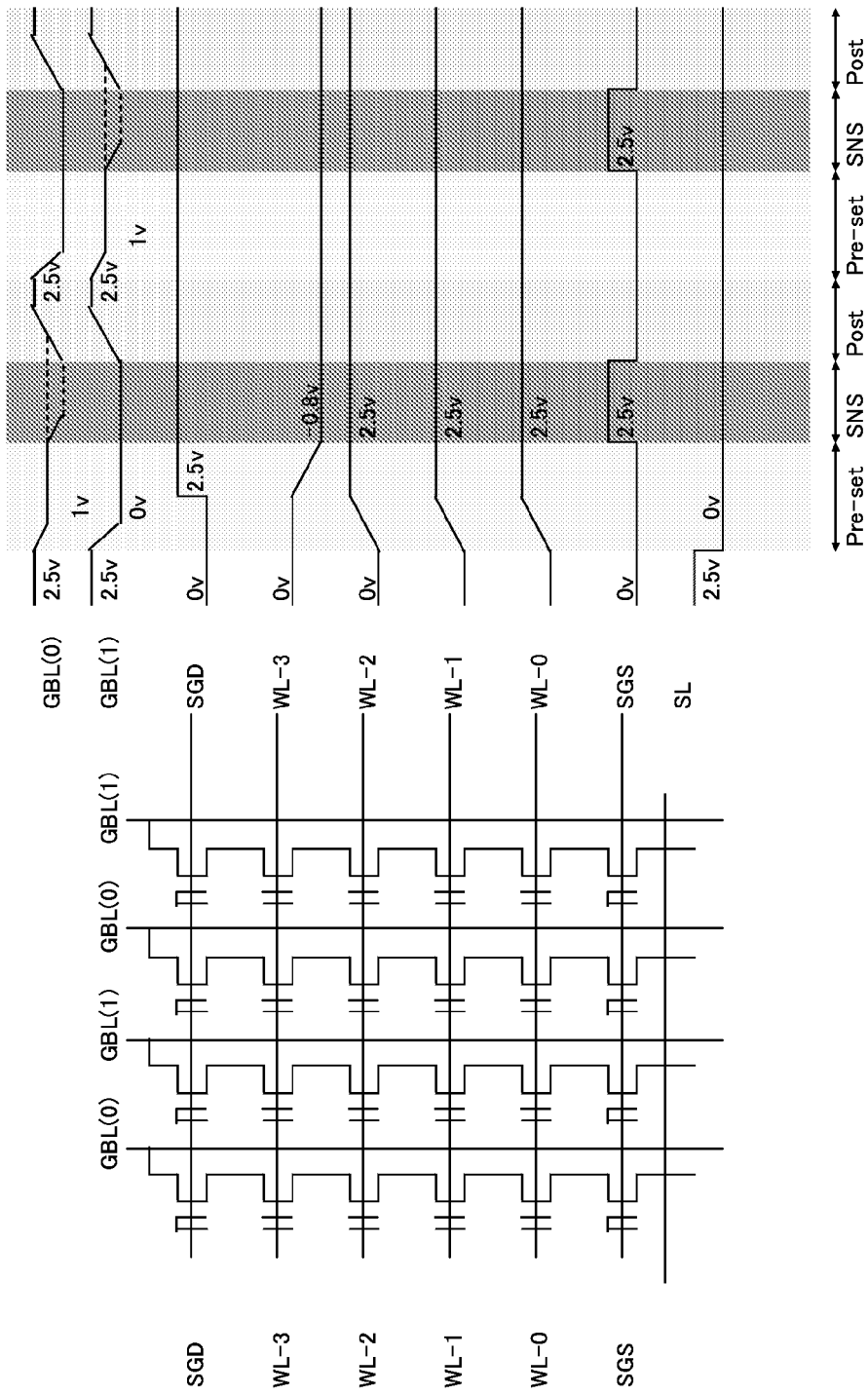
FIG. 7 is a schematic circuit diagram of an enhanced performance NAND flash memory string suitable for code storage.
FIG. 8 is a graph of various signals occurring during operation of the enhanced performance NAND flash memory string of FIG. 7.

FIG. 7 shows two techniques for improving read speed in a NAND flash memory array to enable effective random access. Instead of using 32 word lines as is typical in NAND flash memory arrays, a lesser number is used to achieve higher cell current. While four word lines WL-0:WL-3 are shown in FIG. 7, a fewer number or a greater number of word lines such as, for example, 2 or 8 or 16, may be used consistent with the desired cell current. In addition, the string shown in FIG. 7 uses two bit lines for each bit, which is useful for those strings farther from the X decoder. This is because strings farther from the X decoder of the memory are read more slowly than strings near the X decoder, which delays read time. Read speed throughout the array may be equalized by providing multiple bit lines to the farther strings, which permits higher cell current in those strings and therefore shorter WL delays. Strings nearer the X decoder need have only one bit line. While two bit lines per bit are shown in FIG. 7, the number used for any particular string may be increased or decreased as needed to achieve equalization throughout the array.

Read speed may also be improved by breaking up or segmenting a single array into multiple arrays.

For memory, the read speed=K*(cell current)/(array capacitance) and die size=L*(cell size)=M*(number of contact/cell) where K, L and M are approximately constant. The cell current=N/(number of cells stacked in a string). Array capacitance is proportional to the array size and NAND array size is about ½ of that of NOR since NAND cell size is also about ½ of the NOR cell size. The reason for the smaller NAND cell size is that 32 NAND cells share 2 contacts and 2 additional select transistors, while only two NOR cells share a contact. While these calculations are simplified for ease of understanding, they are sufficiently accurate to show that a NOR array is about 30 times faster than NAND array, while a NAND array is about ½ the size of a NOR array. For cost-sensitive applications, therefore, NAND is very popular because the smaller die size provides cost savings.

By cutting the number of cells in the string from 32 to 4, the cell current of the code storage NAND array may be brought to about ¼ that of NOR cell current. By using another technique, namely adjusting the VT distribution as described below, the cell current of the code storage NAND array may be brought to about ½ that of NOR cell current.

The array size of a NAND array having four-cell NAND strings is similar to that of a NOR array and so is its capacitance. Therefore, its read speed is still a little slower than the read speed of NOR array. Circuit improvements such as the use of two tied-together bit lines for higher cell current at the end of the array may be used to improve the read speed of the code storage NAND array to near that of NOR array.

The code NAND flash memory array of FIG. 7 operates in the following manner. With reference to FIG. 8, during preset, the select gate source line is lowered from 2.5 v to 0 v, the unselected word lines WL-0, WL-1 and WL-2 are raised from 0 v to 2.5 v, the global bit line GBL(0) is lowered from 2.5 v to 1 v to prepare for a read, the global bit line GBL(1) is lowered from 2.5 v to 0 v, the select gate drain is raised from 0 v to 2.5 v, and the selected word line is lowered from 0 v to −0.8 volt. While the negative voltage may not be necessary, it is useful to accommodate programming variations. During the first sense, the select gate source is raised from 0 v to 2.5 v and the selected cell is read. If no charge is stored, the transistors on WL-3 and GBL(0) conduct and GBL(0) is lowered from 1 v to 0 v, else it remains at 1 v. The steps are repeated except that GBL(0) is lowered to 0 v and GBL(1) is lowered to 1 v. During the second sense, the select gate source remains at 2.5 v and the selected cell is read. If no charge is stored, the transistors on WL-3 and GBL(1) conduct and GBL(1) is lowered from 1 v to 0 v, else it remains at 1 v.

In a data storage NAND array, the larger N of stacked cells in a string results in a wider VT distribution after disturb. Therefore, VTE is quite negative and VTP is quite positive, which requires a higher Vread level for proper pass of the unselected cells. Reaching the higher Vread level takes a longer time and often is done with a charge pump, which slows down the read speed for a typical NAND with 32 cells stacked. In the code storage NAND, VTE may be made less negative that VTE for a data storage NAND by about 1V, and VTP may be made less positive than VTP for a data storage NAND by about 1V, which enables the code storage NAND to achieve faster erase and program times.

Figure 9:
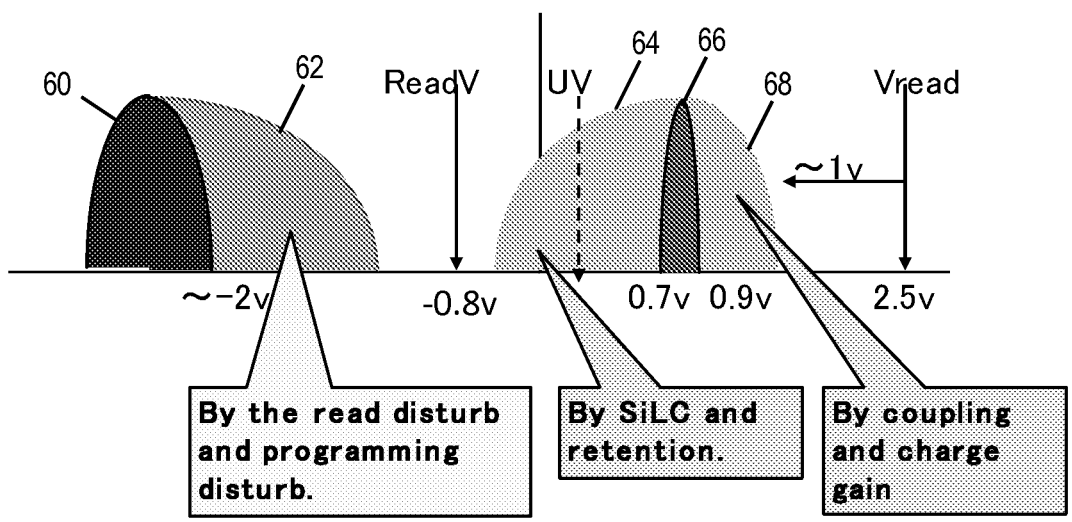
FIG. 9 is a graph of various threshold voltages relating to the enhanced performance NAND flash memory string of FIG. 7.

FIG. 9 shows the VT target of the memory cells in the NAND code flash memory array of FIG. 7. To read a selected cell in a string, the other cells in the string must be conducting, which may be achieved by raising them 2 v or 3 v higher than the programmed region. However, going to a high voltage takes time, so the memory of FIG. 7 achieves a faster read by avoiding the need for high voltage on the unselected word lines. This is done by having the programmed VT close to ground so that the unselected word lines need be raised only to VDD, here 2.5 v. However, putting the programmed VT close to ground has the following impact on the read voltage.

The dark shaded area 60 shows the VT target distribution for a programmed cell. However, due to read disturb and programming disturb, the VT distribution for a programmed cell is extended over the area 62. The dark shaded area 66 shows the VT target distribution for an erased cell. However, due to SiLC and retention (charge loss over time), the VT distribution for an erased cell is extended over the area 64, and due to coupling and charge gain the VT distribution for an erased cell is further extended over the area 68. Therefore, in those situations in which a zero read voltage is risky, a read voltage of around minus 0.8 v, for example, is suitable.

Figure 10:
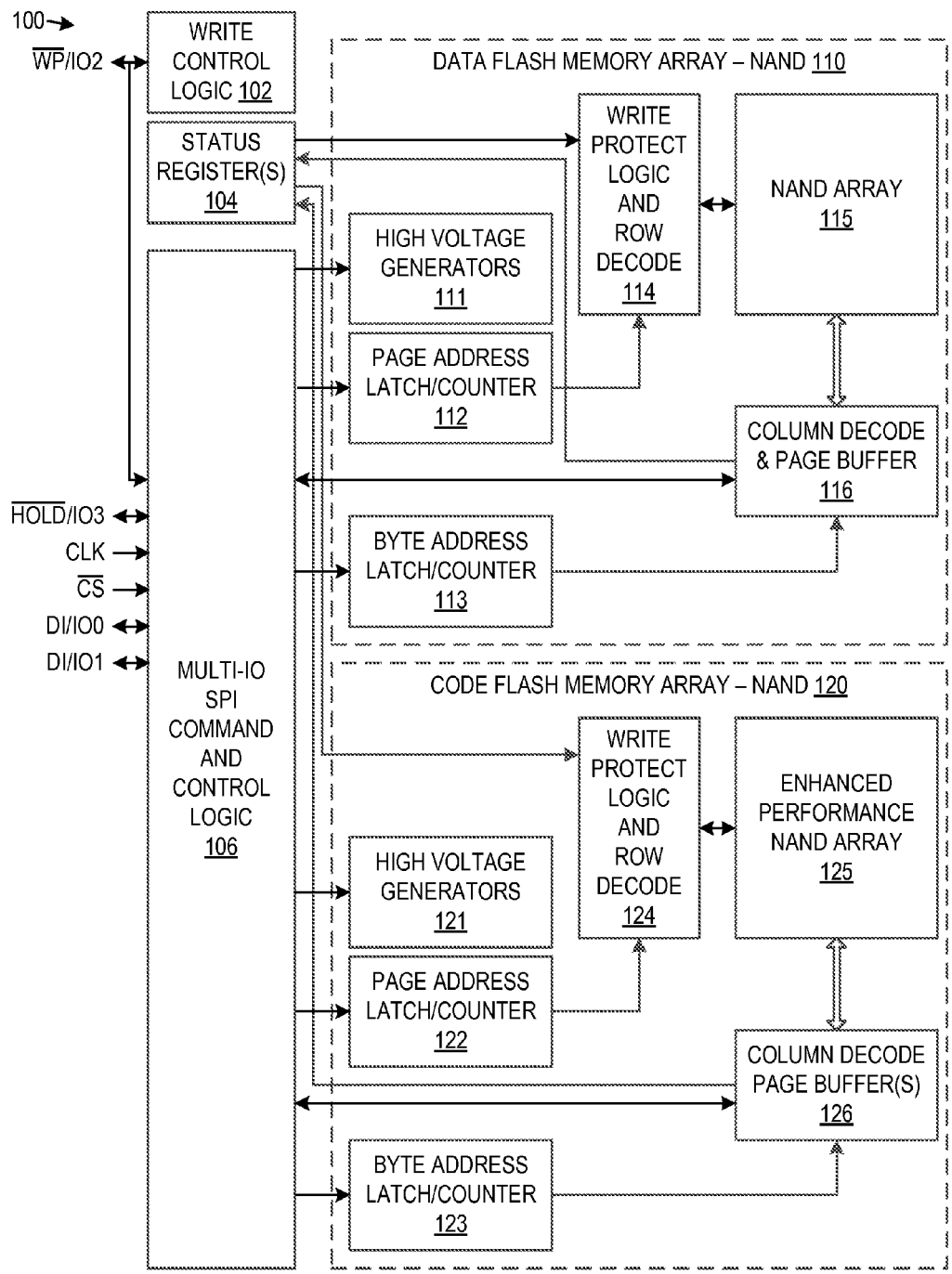
FIG. 10 is a schematic block diagram of a memory having a NAND flash memory array for code storage and a NAND flash memory array for data storage.
Figure 11:
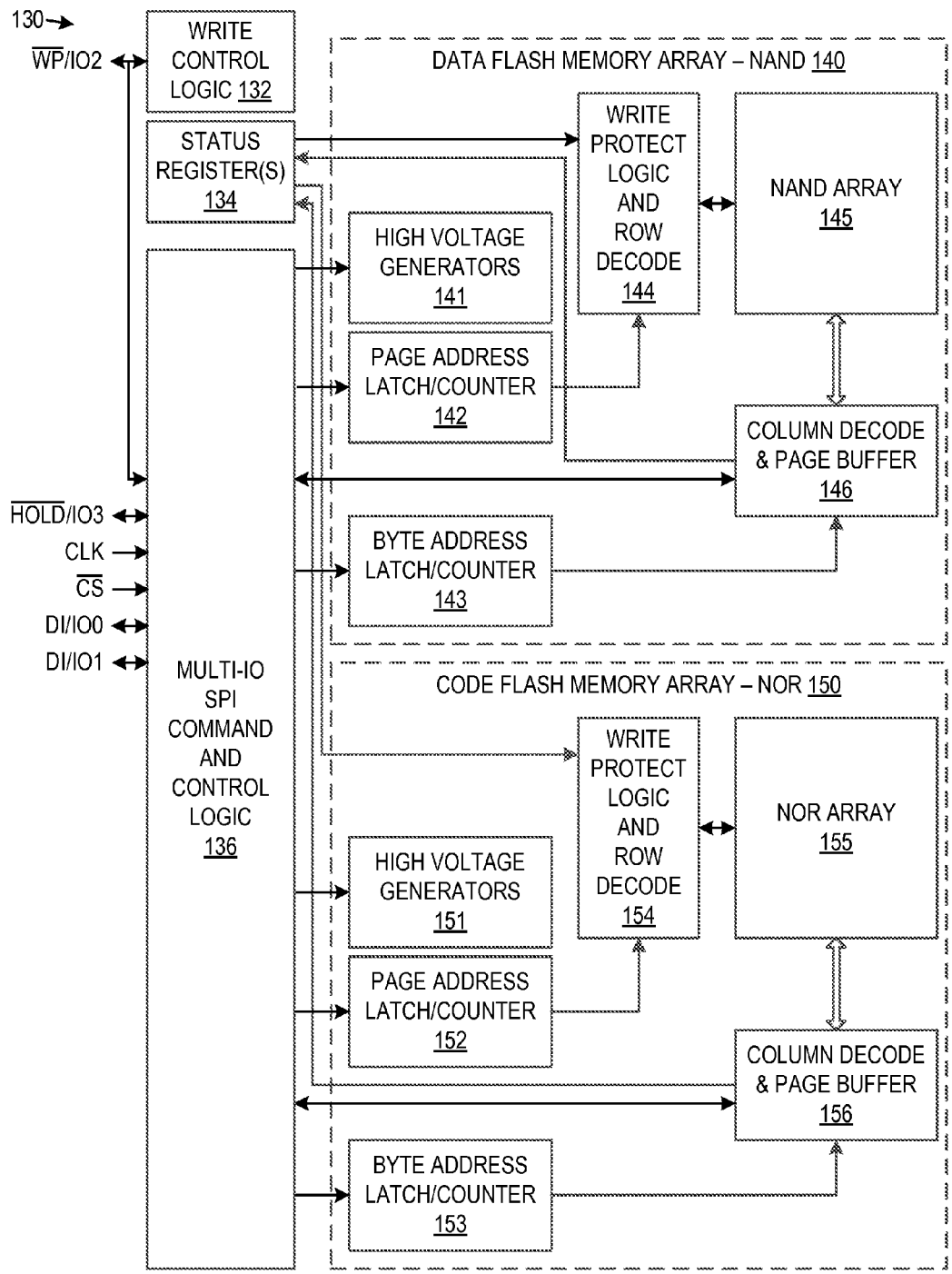
FIG. 11 is a schematic block diagram of a memory having a NOR flash memory array for code storage and a NAND flash memory array for data storage.

FIG. 10 shows an example of an illustrative implementation of the memory 10 of FIG. 1 with a NAND code flash memory array 125, and FIG. 11 shows and example of an illustrative implementation of the memory 10 of FIG. 1 with a NOR code flash memory array 155. Additional detail on the multi-IO SPI interface and on the circuits related to the memory arrays may be found in U.S. Pat. No. 7,558,900 issued Jul. 7, 2009 to Jigour et al., and in a publication by Winbond Electronics Corporation, W25Q128BV: SpiFlash 128 M-Bit Serial Flash Memory with Dual and Quad SPI: Preliminary Revision D, Hsinchu, Taiwan, R.O.C., Jul. 8, 2010, which hereby are incorporated herein in their entirety by reference thereto. In the memory 100 (FIG. 10), the NAND code flash memory array 125 is an enhanced performance NAND flash memory array using the techniques described herein. Performance of the memory 100 may be further improved for code storage by providing the column decode page buffer(s) 126 with the single buffer or dual buffer performance enhancement techniques described in U.S. Pat. No. 5,724,303 issued Mar. 3, 1998 to Gannage et al., and U.S. Pat. No. 5,862,099 issued Jan. 19, 1999 to Gannage et al., which hereby are incorporated herein in their entirety by reference thereto. The high voltage generators 141 and 151 are shown separate but in some implementations may be shared for both code and data storage. In FIG. 11, where the high voltage generators 141 and 151 are shared for both code and data storage, it may be desirable for the drain pump (not shown) for the NOR array 155 to be independently located.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, specific values given herein are illustrative, and may be varied as desired. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A flash memory comprising:
   a first chip comprising:
      a NOR flash memory array specialized for code storage; and
      a first multi-input/output Serial Peripheral Interface coupled to the NOR flash memory array and having a plurality of configurable pins configurable as a single Serial Peripheral Interface or as a quad Serial Peripheral Interface to provide access to the NOR flash memory array;
   a second chip comprising:
      a NAND flash memory array specialized for data storage; and
      a second multi-input/output Serial Peripheral Interface coupled to the NAND flash memory array and having a plurality of configurable pins configurable as a single Serial Peripheral Interface or as a quad Serial Peripheral Interface in the same manner as the configurable pins of the first multi-input/output Serial Peripheral Interface to provide access to the NAND flash memory array; and a multi-chip package containing the first chip and the second chip and comprising a plurality of pins mounted thereon, at least some of the pins of the multi-chip package being configurable pins, and each of the configurable pins of the multi-chip package being coupled to respective same-type configurable pins of the first and second multi-input/output Serial Peripheral Interfaces.

2. A flash memory as in claim 1 wherein the pins of the multi-chip package consist of eight pins common to pins of both the first multi-input/output Serial Peripheral Interface and the second multi-input/output Serial Peripheral Interface, the eight pins respectively being a power pin, a ground pin, a clock pin, a chip select pin, a configurable hold or input/output pin, a configurable write-protect or input/output pin, a configurable data out or input/output pin, and a configurable data in or input/output pin.

3. A flash memory as in claim 2 wherein:
the first multi-input/output Serial Peripheral Interface is further configurable as a dual Serial Peripheral Interface;
the second multi-input/output Serial Peripheral Interface is further configurable as a dual Serial Peripheral Interface; and
the pins of the multi-chip package are further configurable in a dual serial configuration to provide access to the NOR flash memory array and to the NAND flash memory array.

* * * * *